United States Patent [19]

Bass et al.

[11] Patent Number: 4,639,542
[45] Date of Patent: Jan. 27, 1987

[54] MODULAR THERMOELECTRIC CONVERSION SYSTEM

[75] Inventors: John C. Bass; Norbert B. Elsner, both of La Jolla, Calif.

[73] Assignee: GA Technologies Inc., San Diego, Calif.

[21] Appl. No.: 618,991

[22] Filed: Jun. 11, 1984

[51] Int. Cl.$^4$ .............................................. H01L 35/28
[52] U.S. Cl. ..................................... 136/210; 136/209
[58] Field of Search .................................. 136/205–210

[56] References Cited

U.S. PATENT DOCUMENTS

| | | | |
|---|---|---|---|
| 3,082,275 | 3/1963 | Talaat | 136/4 |
| 3,234,048 | 2/1966 | Nelson | 136/4 |
| 3,269,873 | 8/1966 | Dent | 136/208 |
| 3,297,492 | 1/1967 | Pepper | 136/208 |
| 3,304,205 | 2/1967 | Lord et al. | 136/208 |
| 3,418,173 | 12/1968 | Lockwood | 136/208 |
| 3,428,496 | 2/1969 | Lockwood | 136/208 |
| 3,441,752 | 4/1969 | Grover et al. | 310/4 |
| 3,457,121 | 7/1969 | Tomlinson | 136/208 |
| 3,497,397 | 2/1970 | Huber | 136/208 |
| 3,719,532 | 3/1973 | Falkenberg et al. | 136/208 |
| 3,808,056 | 4/1974 | Pitcher et al. | 136/208 |
| 3,881,962 | 5/1975 | Rubinstein | 136/209 |
| 4,047,093 | 9/1977 | Levoy | 322/2 R |
| 4,218,266 | 8/1980 | Guazzoni et al. | 136/205 |
| 4,298,768 | 11/1981 | Israel et al. | 136/202 |

OTHER PUBLICATIONS

"Thermoelectric Generators" *Gulf Trade Journal.*
Design Status of the Improved Fossil Fired Thermoelectric Generator Program, by Bass and Elsner, published in Apr. 1982.

*Primary Examiner*—John F. Terapane
*Assistant Examiner*—T. J. Wallen
*Attorney, Agent, or Firm*—Fitch, Even, Tabin & Flannery

[57] ABSTRACT

A thermoelectric conversion system including a burner assembly and a number of thermoelectric conversion modules for converting thermal energy resulting from the operation of the burner assembly into electrical energy. The burner assembly includes a central combustion chamber and a number of longitudinally extending heat pipes each having an evaporator section and a condenser section with the evaporator sections positioned at spaced locations around the combustion chamber. The system also includes flow means for causing the hot gases provided by the combustion chamber to flow past the evaporator sections. The heat pipes and the conversion modules correspond in number, with each of the modules connected in heat transfer relationship with a corresponding heat pipe condenser section.

14 Claims, 5 Drawing Figures

MODULAR THERMOELECTRIC CONVERSION SYSTEM

The Government has rights in this invention pursuant to Contract DAAK 20-81-C-0431 awarded by the Department of Defense.

BACKGROUND OF THE INVENTION

The present invention relates to electrical power supplies, and more particularly, to a lightweight, portable thermoelectric converter adapted to burn a liquid hydrocarbon.

Heretofore, the typical means for supplying electrical power in the field or for emergency purposes was through the use of an electrical generator powered by a diesel engine. Such generators were heavy, noisy and were subject to malfunction and breakdown due to their great number of moving mechanical components.

A thermoelectric converter includes a burner for providing heat and a section including a number of thermocouples for converting the thermal energy into electrical energy. Various fossil fired thermoelectric converters have been proposed and manufactured. Such converters typically have been annular in configuration with the thermoelectric elements evenly spaced in rows placed around a central cylindrical wall or hot plate which was heated directly by combustion gases and/or by radiation from a mantle. Such units were ordinarily air-cooled with extended surface cooling fins located around the outside of the converter. Such prior art converters were relatively heavy because of the large heat sink. Additionally, these converters were built as a unit. Accordingly, should a higher output converter be required, a complete redesign was required. That is, parts from the old converter could not be readily adapted for use in a new, higher output converter.

One prior art thermoelectric converter was semi-modular in construction in that the fuel combustion area was isolated from the thermoelectric elements which were arranged in radially extending groupings. A two-phase vapor heat transfer method was utilized with separate inlet and outlet piping required for each thermoelectric grouping or module. For additional information concerning the structure and operation of such prior art liquid hydrocarbon fired thermoelectric converters, reference may be made to U.S. Pat. Nos. 3,808,056 and 3,881,962.

SUMMARY OF THE INVENTION

Among the several aspects of the present invention may be noted the provision of an improved modular thermoelectric converter system. The electric power output of the converter system can be easily increased by the addition of thermoelectric modules which addition does not result in an increase in the circumference of the unit. The converter incorporates heat pipes and each converter module is adapted for attachment to a heat pipe-condenser section remote from the heating location of the heat pipe evaporator sections. The converter of the present invention is lightweight because liquid cooled heat sinks are used. Additionally, the converter is highly efficient as it functions to preheat incoming air by use of hot exhaust gases. Furthermore, the converter of the present invention is reliable and quiet in use, has long service life, and is relatively easy and economical to manufacture. Additional features and advantages of the thermoelectric conversion system of the present invention will be, in part, apparent and, in part, pointed out specifically in the following specification and in the accompanying claims and drawings.

Briefly, the thermoelectric conversion system of the present invention includes an elongate burner assembly and a number of thermoelectric conversion modules. The burner assembly includes a central combustion chamber, a number of longitudinally extending heat pipes each having an evaporator section and a condenser section, and flow means for causing hot gases provided by the combustion chamber to flow past the evaporator sections. The evaporator sections are positioned at spaced locations about the combustion chamber. The conversion modules and the heat pipes correspond in number, with each of the modules connected in heat transfer relationship with a corresponding heat pipe condenser section.

BRIEF DESCRIPTION OF THE DRAWINGS

Corresponding reference characters indicate corresponding components throughout the several drawings.

DESCRIPTION OF THE PREFERRED EMBODIMENT

Figure 1:
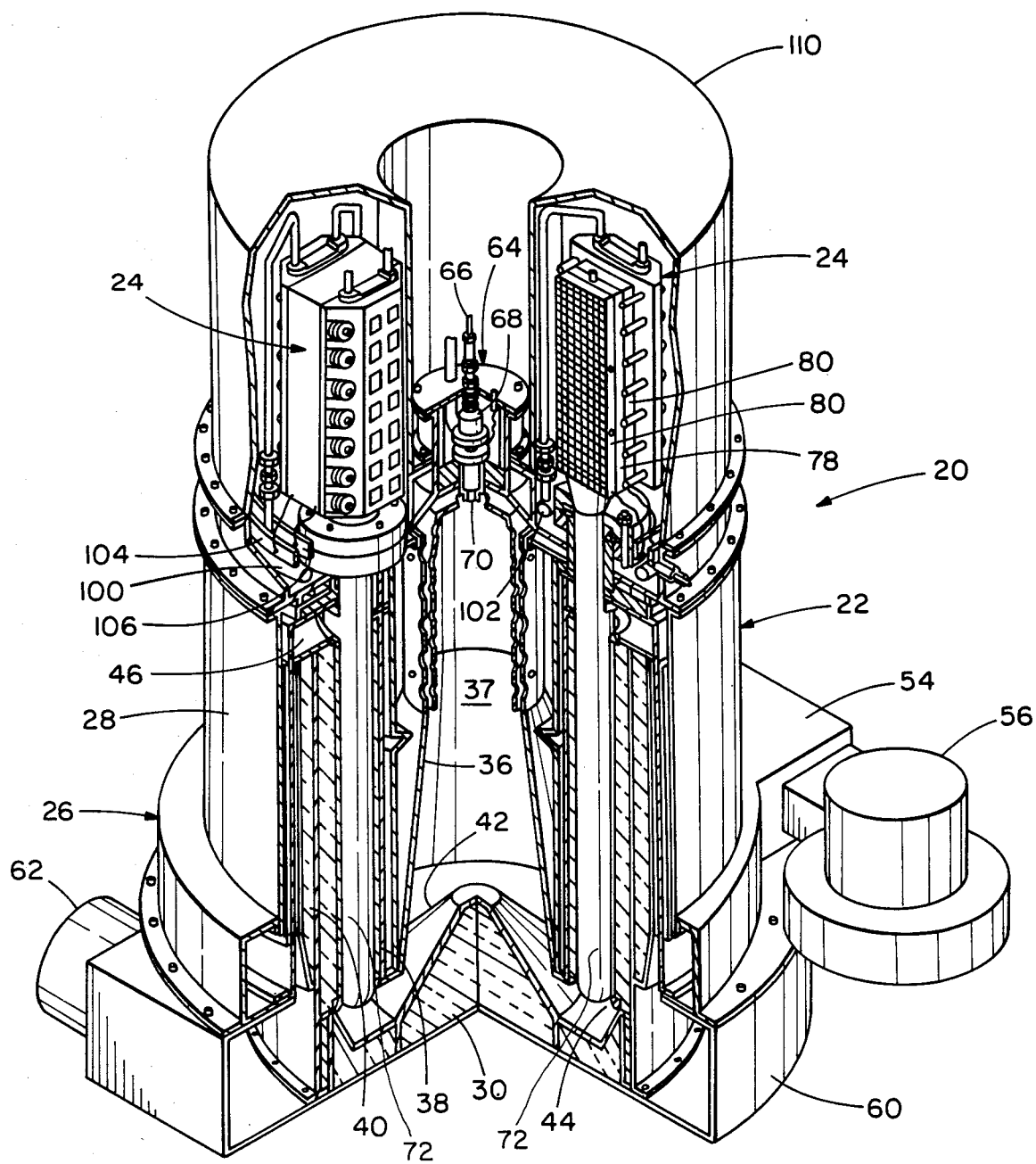
FIG. 1 is an isometric view of a thermoelectric converter system of the present invention including a burner assembly and a plurality of thermoelectric conversion modules, with certain components removed or cut away to expose other components.

Referring now to the drawings, a thermoelectric conversion system adapted for use in supplying electricity in the field, is generally indicated by reference character 20. The conversion system 20 includes an elongate burner assembly 22 and a plurality of thermoelectric conversion modules 24 mounted on the burner assembly for converting thermal energy resulting from the operation of the burner assembly into electrical energy.

Figure 2:
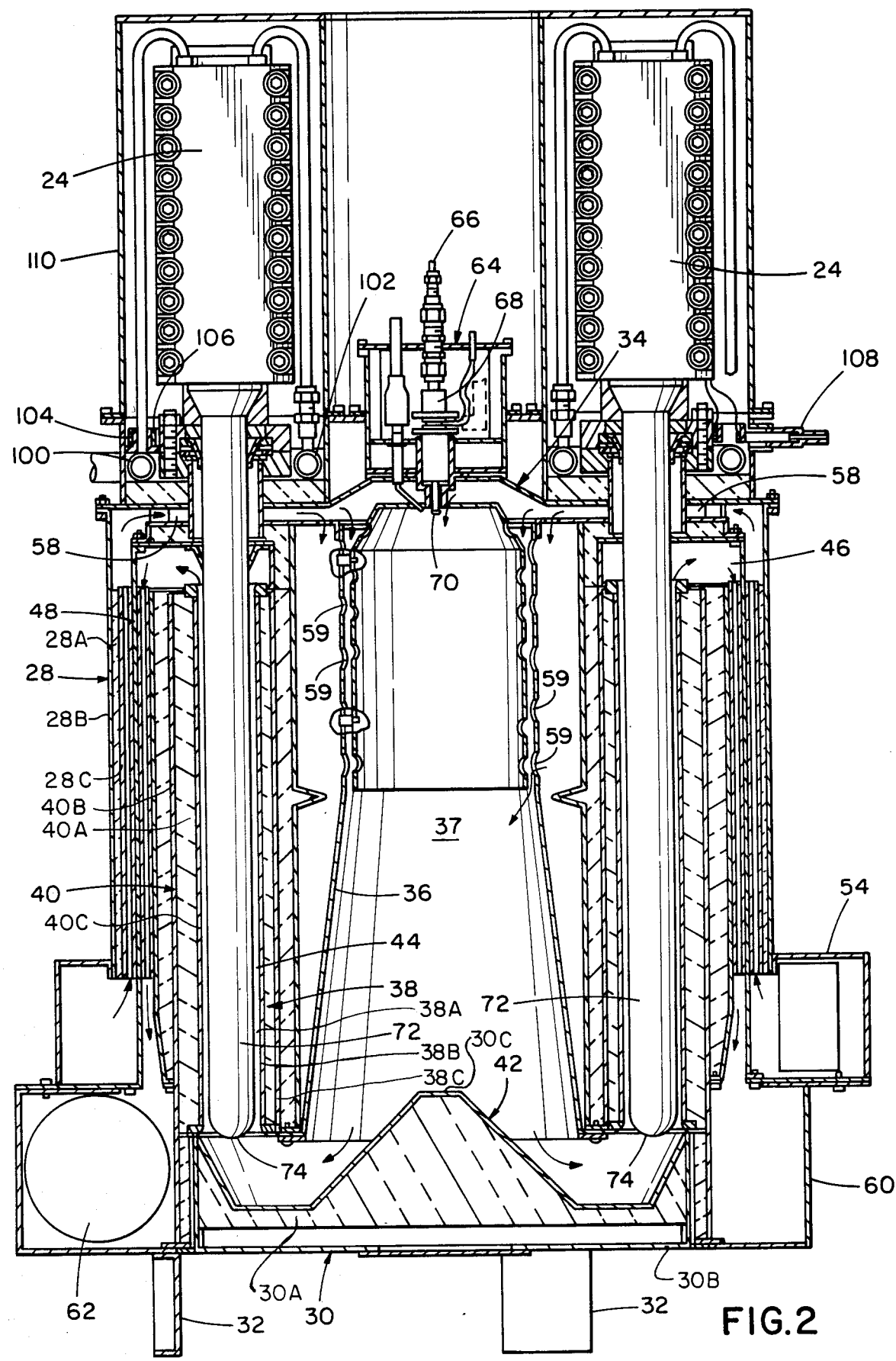
FIG. 2 is an axial cross-sectional view of the burner assembly of FIG. 1.

As best shown in FIGS. 1 and 2, the burner assembly 22 includes an enclosure 26 comprising an elongate annular outer wall 28 extending between a base 30 to which are attached a plurality of support feet 32, and an upper end wall 34. Dependent from the upper end wall is an enclosure 36, partly frusto-conical in shape, defining a combustion chamber 37. Surrounding the combustion chamber are first, second and third annular closed walls which are spaced from one another. The first and second walls are identified by reference numerals 38 and 40, respectively, while the third wall is enclosure outer wall 28. Each of the aforementioned walls and base is preferably thermally insulative and has a layer of insulation 28A, 38A, 40A and 30A, respectively, disposed between inner and outer metallic skins 28B and 28C, 38B and 38C, 40B and 40C and 30B and 30C, respectively, fabricated of a suitable high temperature metal.

The inner skin of the base 30 forms a diverter 42 for reversing the output hot gas flow of the combustion chamber and directing it between the first and second walls which form a flow tube 44 leading to a plenum 46 disposed adjacent the burner assembly end wall 34, where the direction of flow of the combustion products is again reversed. Positioned between the second wall 40 and the outer or third wall 28 is a cylindrical recuperator (counterflow heat exchanger) core 48, best shown in FIG. 2, which may be provided with longitudinally extending interior and exterior fin arrays. The burner assembly further includes an air inlet passageway system for conveying air to the chamber 37 for mixture with fuel and combustion, and a gas outlet passageway system for exhausting the gaseous products of combustion. The inlet passageway system includes annular inlet ducting 54 on which is mounted a blower motor 56 for forcing incoming air between the recuperator core 48 and the outer wall 28. The inlet system also includes passageways 58 for supplying the inlet air between the first wall 38 and the enclosure 36 which has spaced inlet openings 59 for supplying air to the combustion chamber 37. The outlet passageway system includes annular outlet ducting 60, having an exhaust pipe 62, for receiving the exhaust gases from the plenum 46 and which are caused to pass between the recuperator core 48 and the second wall 40 to preheat the relatively cool inlet air.

Mounted on the burner assembly end wall 34 and extending into the combustion chamber 37 opposite the diverter 42 is a fuel inlet and ignition assembly 64. This assembly includes an inlet liquid fuel line 66, an atomizer 68 for converting the incoming liquid fuel into a fine spray, and electrical ignition means such as a spark generator 70 for firing the inlet air and fuel mixture. Such fuel and ignition assemblies are well known to those of skill in the burner art and need not be further described herein.

As best shown in FIG. 1, a generally circular array of regularly spaced, vertically positioned heat pipe evaporator sections 72 is disposed in the flow tube 44. Each of the sections 72 is elongate and has a closed first end 74 positioned adjacent the diverter 42. Each evaporator section 72 is integral with a condenser section 78 (shown in FIG. 4) with the two sections constituting a heat pipe. The heat pipe functions as a high efficiency thermal energy transfer device and employs evaporation, condensation and surface-tension pumping of a liquid in a capillary wick to transfer the latent heat of vaporization of the pipe working fluid from the flow tube 44 to two thermopiles 80 (see FIG. 4) positioned on the flattened sides of the condenser section. Potassium has been chosen as a suitable working fluid for this application. The condenser section 78 and the evaporator section 72 form a closed container with a wick disposed against the inside wall of the container. The hot exhaust gases passing the first ends 74 of the evaporator sections results in boiling of the potassium, the vapor of which moves to the condenser section by traveling in the open mid-portion of the heat pipe. Upon giving up the latent heat of vaporization to the thermopiles, condensation occurs with the potassium liquid being returned to the evaporator section by traveling adjacent the inside surface of the heat pipe container due to gravity and/or the capillary action of the wick. Further information regarding the design and operation of heat pipes is provided in "Designer's Guide to Heat Pipes", *Design News*, Mar. 18, 1974, pp. 159-184.

Figure 3:
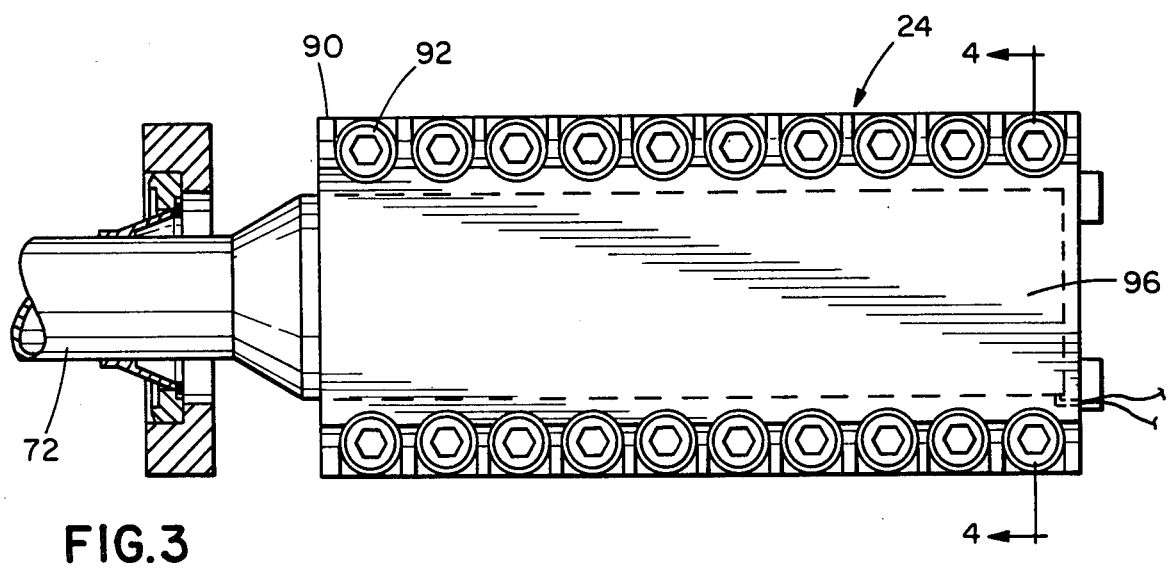
FIG. 3 is a side elevational view, partly in section, of a thermoelectric module of the converter system of the present invention.
Figure 4:
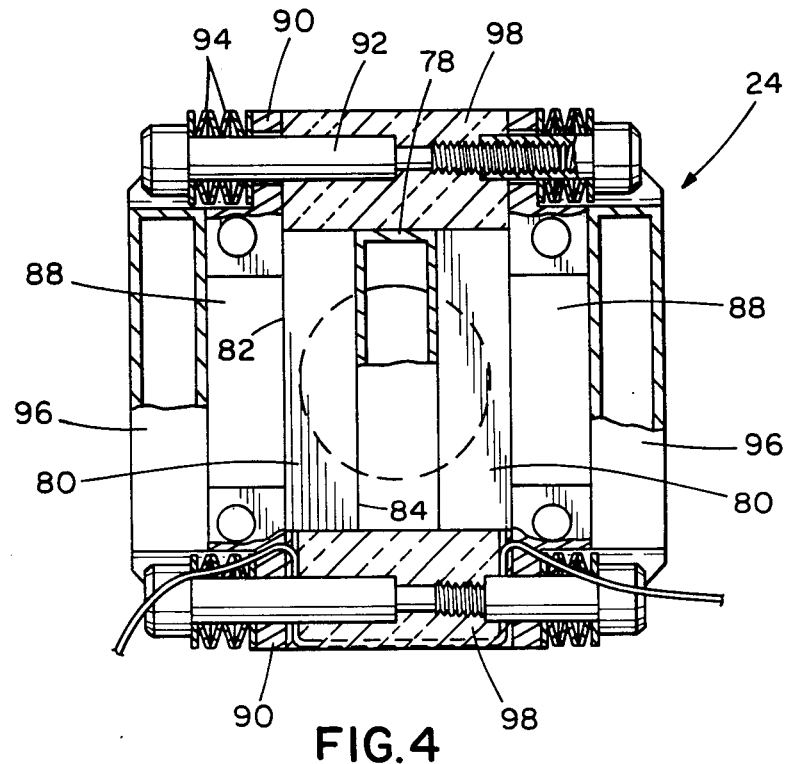
FIG. 4 is a view of the thermoelectric module taken generally along line 4—4 of FIG. 3, with certain components not shown in section.
Figure 5:
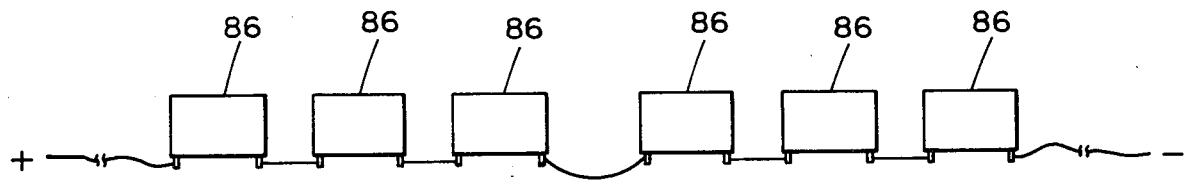
FIG. 5 is a simplified electrical schematic diagram of one of the thermoelectric conversion modules.

The thermoelectric conversion modules are arranged in a circular array mounted on their corresponding heat pipe condenser sections on the side of upper end wall 34 opposite the combustion chamber 37. Referring to FIGS. 3 and 4, in each conversion module 24 the condenser section 78 of the heat pipe is centrally located and flanked by thermopiles 80. Each thermopile 80 is a generally rectangular array of couples of N and P thermoelectric elements, preferably formed of lead telluride, and has a cold side 82 and a hot side 84. Reference may be made to U.S. patent application Ser. No. 619,052, filed June 11, 1984 now U.S. Pat. No. 4,611,089, dated Sept. 9, 1986, for more information regarding a preferred thermopile assembly for use in the present invention. As shown in FIG. 5, each thermopile 80 is made up of a number of couple groupings 86 connected in series with the thermopiles 80 on each side of a condenser section also connected in series. While each thermopile is shown as being made up of three couple groupings, it will be appreciated that the particular number of groupings per thermopile is for purposes of illustration only.

Each module further includes a liquid cooled heat sink 88 in contact with the cold side of each thermopile. Each heat sink has a pair of opposed apertured mounting flanges 90 for receiving clamping bolts 92 to hold the modules together on their condenser sections. Spring means, in the form of Belleville washers 94, are used beneath the bolt heads to bias the heat sinks against their corresponding thermopile surfaces. A metal can 96 is attached to the outside of each heat sink. Each can is evacuated and backfilled with a low thermal conductivity inert gas, such as xenon, to prevent excessive heat loss. Insulative blocks 98 are positioned against the remaining sides of the condenser section 78 and thermopiles to further reduce heat losses.

The heat sinks are connected by coolant lines to annular coolant inlet and outlet piping 100 and 102, respectively, which in turn are connected to an external radiator system (not shown). The positive and negative leads of each module are connected to annular positive and negative bus bars 104 and 106, respectively, which in turn are connected to an electrical power outlet 108. The conversion system also includes an end cover 110 for connection to the burner assembly end wall 34 to enclose and shield the conversion modules and to give the system 20 a unitary appearance.

It will be appreciated that each module is simply bolted to its heat pipe condenser section. Accordingly, it is a simple matter to strip the modules from a particular conversion system 20 and to reattach them for use with another system. This is in sharp contrast to prior art conversion systems which did not incorporate modular thermoelectric converters.

The modules 24 shown in FIGS. 1 and 2 can be considered to be arranged in a first bank disposed adjacent the upper end wall 34 of the burner assembly. It is possible to increase the electrical power output of system 20 without a complete redesign. This power output increase can be realized by placing an additional heat pipe evaporator section between each originally installed pair of such sections. Each of the added condenser sections would be elongated and connected to a member of a second bank of conversion modules disposed above the first bank. Thus by using the additional heat pipes and a second bank of conversion modules, the power output of the system can be greatly increased by increasing the amount of fuel used while retaining almost all of the components of the original system and without increasing the diameter of the system.

An example of a thermoelectric conversion system 20 of the present invention could have the following characteristics. The temperature at the first ends 74 of the evaporator sections is about 1100° C. and the exhaust gas temperature at the plenum 46 is about 700° C. The temperature of the exhaust gas and the temperature of the inlet air to the combustion chamber 37 are both about 350° C. The preferable hot and cold thermopile temperatures are about 600° C. and 100° C., respectively. The coolant pumped through the heat sinks 88 is desirably a mixture of 50% water and 50% glycol. The electrical output of the thermoelectrical conversion system 20 is two kilowatts with each of the eight modules providing 250 watts at 28 volts.

Operation of the thermoelectric conversion system 20 of the present invention is as follows: After connection of the system 20 to an external electrical power source, such as a battery, to initially energize the blower motor 56 and the atomizer 68 and the spark generator 70, the sytem 20 starts combustion by the ignition of an atomized fuel and inlet air mixture. It is noted that the inlet air enters the combustion chamber tangentially to cause the gas in the chamber to swirl thereby creating a uniform mixing of the combustion products. The diverter 42 functions to reverse the flow of the exhaust gases and guides them into the flow tube 44 where they move past the heat pipe evaporator sections 72 and into the plenum 46. It is noted that heat is transferred to the evaporator sections not only by forced convection, but also by radiation because the wall 40 defining the flow tube is insulated. The exhaust gases have their direction again reversed and then travel between the recuperator core 48 and the second wall 40 and into the outlet ducting 60 to the exhaust pipe 62. The recuperator functions to preheat inlet air which is forced into the system by means of the blower motor 56. The inlet air moves through the inlet ducting 54 and between the recuperator core and the outer wall 28 where it is preheated. The air then moves through the radial passageways 58 and between the insulated first wall 38 and the combustion chamber enclosure 36 through inlet openings 59.

After the heat pipes come up to their operating temperature, the potassium in the evaporator sections 72 boils causing vapor to move to the condenser section 78 disposed inside the thermoelectric conversion module 24. The potassium vapor condenses and the resulting latent heat of vaporization is transferred to the hot sides 84 of the thermopiles 80. A portion of the thermal energy, approximately 9–10% depending upon the temperature of the hot and cold junctions, is converted to electricity by the thermoelectric effect. Energy rejected by the thermopiles is transferred to the heat sinks 88, to the liquid coolant and then dissipated by the external radiator, not shown. The Belleville washers 94 function to keep the heat sinks in firm engagement with the cold sides of the thermopiles which are in turn pushed against the flattened sides of the condenser section of the heat pipe.

It will be appreciated that the divergent shape of the combustion chamber 37 functions to stabilize the flame by promoting continuous combustion along the enclosure 36 so that once ignited, the flame is self-sustaining. The combustion chamber 37 is also sized to control the gas velocity within the chamber so that it will not exceed the flame velocity resulting in "flame out." The atomizer 68 may be a commercially available ultrasonic liquid vaporizer and is usable with a number of liquid hydrocarbon fuels to promote more complete combustion over a wide range of possible fuels which include methane as well as fossil fuels.

In view of the above, it will be seen that the several objects of the invention are achieved and other advantageous results attained.

As various changes could be made without departing from the scope of the invention, it is intended that all matter contained in the above description shall be interpreted as illustrative and not in a limiting sense.

What is claimed is:

1. A thermoelectric conversion system including a burner assembly and a plurality of modules for converting thermal energy resulting from the operation of said burner assembly into electrical energy, said burner assembly comprising:

a central combustion chamber for providing hot gase;

a plurality of heat pipes extending vertically throughout their length with each having an evaporator section for boiling a liquid to form vapor and a condenser section for condensing said vapor to form said liquid with the evaporator sections hanging pendant and disposed at spaced locations about said combustion chamber; and flow means for causing the hot gases provided by said combustion chamber to flow past said evaporator sections thereby heating said sections to boil said liquid, said heat pipes and said conversion modules corresponding in number, with each of said modules connected in heat transfer relationship with a corresponding heat pipe condenser section.

2. A system as set forth in claim 1 wherein said flow means comprises elongate flow tube means disposed about said combustion chamber, said heat pipe evaporator sections being disposed in said flow tube means.

3. A system as set forth in claim 2 wherein said burner assembly further includes an air inlet passageway system for conveying inlet air to said chamber, and further includes a gas outlet passageway system for exhausting combustion products which have passed through said flow tube means.

4. A system as set forth in claim 3 wherein said burner assembly includes a diverter for changing the direction of flow of hot gases from said combustion chamber and said outlet passageway system includes a plenum with said flow tube means extending between said plenum and said diverter.

5. A system as set forth in claim 4 wherein said combustion chamber is defined in part by a frusto-conical wall opening to said diverter, said burner assembly further comprising a fuel inlet system disposed remote from said diverter, said fuel inlet system comprising an atomizer for converting incoming liquid fuel to a fine spray and ignition means for igniting the combination of said spray and said inlet air.

6. A system as set forth in claim 5 wherein said air inlet passageway system includes a blower and supplies pressurized inlet air to said combustion chamber.

7. A system as set forth in claim 3 wherein said burner system further comprises a recuperator disposed surrounding said flow tube means for preheating inlet air by transferring heat from the combustion products to said inlet air.

8. A system as set forth in claim 7 wherein said recuperator comprises an elongate metallic tubular core with the hot combustion products passing one longitudinal side thereof and the relatively cool inlet air passing the other longitudinal side of said core.

9. A system as set forth in claim 1 wherein said burner assembly further comprises an end wall with said combustion chamber disposed on one side thereof and said conversion modules disposed on the other side thereof.

10. A system as set forth in claim 9 wherein each thermoelectric conversion module is attached to a corresponding condenser section, the condenser sections being disposed on said other side of said end wall.

11. A system as set forth in claim 10 wherein each module comprises a pair of spaced thermopiles for attachment to a heat pipe condenser section with the hot sides of said thermopiles facing one another with said condenser section disposed therebetween.

12. A system as set forth in claim 11 wherein each module comprises a heat sink disposed against the cold side of each thermopile.

13. A system as set forth in claim 12 wherein each heat sink is liquid cooled and each module further comprises spring means biasing each heat sink against its corresponding thermopile.

14. A thermoelectric conversion system including a burner assembly and a plurality of modules for converting thermal energy resulting from the operation of said burner assembly into electrical energy, said burner assembly comprising:

a central combustion chamber for providing hot gases;

a plurality of vertically extending heat pipes each having an evaporator section for boiling a liquid to form vapor and a condenser section for condensing said vapor to form said liquid with the evaporator sections disposed at spaced locations about said combustion chamber; and flow means for causing the hot gases provided by said combustion chamber to flow past said evaporator sections thereby heating said sections to boil said liquid, said heat pipes and said conversion modules corresponding in number, with each of said modules connected in heat transfer relationship with a corresponding heat pipe condenser section, said flow means comprising elongate flow tube means disposed about said combustion chamber, said heat pipe evaporator sections being disposed in said flow tube means, said burner assembly further including an air inlet passage way system for conveying inlet air to said chamber, and further including a gas outlet passageway system for exhausting combustion products which have passed through said flow tube means, said burner system further comprising a recuperator disposed surrounding said flow means for preheating inlet air by transferring heat from the combustion products to said inlet air, said recuperator comprising an elongate metallic tubular core with the hot combustion products passing one longitudinal side thereof and the relatively cool inlet air passing the other longitudinal side of said core, said system comprising a first thermally insulative annular wall disposed about said combustion chamber, a second such wall disposed inwardly of said recuperator and a third such wall disposed surrounding said recuperator, said flow tube means being defined by said first wall and said second wall; said second wall, said third wall and said recuperator cooperating to cause said hot combustion products to pass said one core side and said relatively cool air to pass said other core side.

* * * * *